(12) United States Patent
Tanida et al.

(10) Patent No.: US 11,355,462 B2
(45) Date of Patent: Jun. 7, 2022

(54) SEMICONDUCTOR DEVICE WITH A SEMICONDUCTOR CHIP CONNECTED IN A FLIP CHIP MANNER

(71) Applicant: ROHM CO., LTD., Kyoto (JP)

(72) Inventors: Kazumasa Tanida, Chiba (JP); Osamu Miyata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/039,089

(22) Filed: Sep. 30, 2020

(65) Prior Publication Data

US 2021/0013168 A1 Jan. 14, 2021

Related U.S. Application Data

(63) Continuation of application No. 16/703,266, filed on Dec. 4, 2019, now Pat. No. 10,818,628, which is a (Continued)

(30) Foreign Application Priority Data

Sep. 28, 2004 (JP) ................................. 2004-282017

(51) Int. Cl.
*H01L 23/00* (2006.01)
*H01L 23/31* (2006.01)
(Continued)

(52) U.S. Cl.
CPC ............ *H01L 24/16* (2013.01); *H01L 21/563* (2013.01); *H01L 23/3142* (2013.01);
(Continued)

(58) Field of Classification Search
None
See application file for complete search history.

(56) References Cited

U.S. PATENT DOCUMENTS

| 5,218,234 A | 6/1993 | Thompson et al. |
| 5,510,758 A | 4/1996 | Fujita et al. |
| (Continued) | | |

FOREIGN PATENT DOCUMENTS

| JP | S60171754 A | 9/1985 |
| JP | S60194548 A | 10/1985 |
| (Continued) | | |

OTHER PUBLICATIONS

"Capillary Underfill and Mold Encapsulation Materials for Exposed Die Flip Chip Molded Matrix Array Package with Thin Substrate", by Chee Choong Kooi et al., 2003 Electronics Packaging Technology Conference, pp. 324-330.

*Primary Examiner* — Michelle Mandala
(74) *Attorney, Agent, or Firm* — Rabin & Berdo, P.C.

(57) ABSTRACT

A semiconductor device includes a wiring board, a semiconductor chip, and a connecting member provided between a surface of the wiring board and a functional surface of the semiconductor chip. The connecting member extends a distance between the wiring board surface and the functional surface. A sealing material seals a gap space between the wiring board and the semiconductor chip. An electrode is formed at the wiring board surface and arranged outside of an outer periphery of the sealing material. A lateral distance between an outer periphery of the semiconductor chip and the outer periphery of the sealing material is between 0.1 mm and a lateral distance from the outer periphery of the semiconductor chip to the electrode.

11 Claims, 7 Drawing Sheets

Related U.S. Application Data continuation of application No. 15/806,847, filed on Nov. 8, 2017, now Pat. No. 10,522,494, which is a continuation of application No. 15/635,478, filed on Jun. 28, 2017, now Pat. No. 9,831,204, which is a continuation of application No. 14/824,706, filed on Aug. 12, 2015, now Pat. No. 9,721,865, which is a continuation of application No. 14/276,255, filed on May 13, 2014, now Pat. No. 9,117,774, which is a continuation of application No. 13/782,580, filed on Mar. 1, 2013, now Pat. No. 8,754,535, which is a continuation of application No. 10/594,561, filed as application No. PCT/JP2005/013355 on Jul. 21, 2005, now Pat. No. 8,405,227.

(51) Int. Cl.
*H01L 23/498* (2006.01)
*H01L 21/56* (2006.01)
*H01L 23/52* (2006.01)
*H01L 51/52* (2006.01)

(52) U.S. Cl.
CPC ...... *H01L 23/3157* (2013.01); *H01L 23/3185* (2013.01); *H01L 23/49811* (2013.01); *H01L 23/49816* (2013.01); *H01L 23/49838* (2013.01); *H01L 23/52* (2013.01); *H01L 23/562* (2013.01); *H01L 24/17* (2013.01); *H01L 24/28* (2013.01); *H01L 24/32* (2013.01); *H01L 24/73* (2013.01); *H01L 24/81* (2013.01); *H01L 24/83* (2013.01); *H01L 24/01* (2013.01); *H01L 24/75* (2013.01); *H01L 51/5246* (2013.01); *H01L 2224/01* (2013.01); *H01L 2224/0554* (2013.01); *H01L 2224/05568* (2013.01); *H01L 2224/05573* (2013.01); *H01L 2224/16225* (2013.01); *H01L 2224/16227* (2013.01); *H01L 2224/26175* (2013.01); *H01L 2224/32225* (2013.01); *H01L 2224/73204* (2013.01); *H01L 2224/75252* (2013.01); *H01L 2224/81191* (2013.01); *H01L 2224/81815* (2013.01); *H01L 2224/83102* (2013.01); *H01L 2224/92125* (2013.01); *H01L 2924/00014* (2013.01); *H01L 2924/01004* (2013.01); *H01L 2924/01006* (2013.01); *H01L 2924/01015* (2013.01); *H01L 2924/01033* (2013.01); *H01L 2924/01075* (2013.01); *H01L 2924/14* (2013.01); *H01L 2924/153* (2013.01); *H01L 2924/183* (2013.01); *H01L 2924/3512* (2013.01)

(56) References Cited

U.S. PATENT DOCUMENTS

| | | | |
|---|---|---|---|
| 5,710,071 A | 1/1998 | Beddingfield et al. | |
| 5,726,489 A | 3/1998 | Matsuda et al. | |
| 5,849,606 A | 12/1998 | Kikuchi et al. | |
| 6,011,312 A | 1/2000 | Nakazawa et al. | |
| 6,060,768 A | 5/2000 | Hayashida et al. | |
| 6,153,930 A | 11/2000 | Hori | |
| 6,153,938 A | 11/2000 | Kanda et al. | |
| 6,157,080 A | 12/2000 | Tamaki et al. | |
| 6,172,423 B1 | 1/2001 | Lee | |
| 6,181,015 B1 | 1/2001 | Gotoh et al. | |
| 6,208,525 B1 | 3/2001 | Imasu et al. | |
| 6,281,450 B1 | 8/2001 | Urasaki et al. | |
| 6,291,264 B1 | 9/2001 | Tang et al. | |
| 6,303,219 B1 | 10/2001 | Sawamura et al. | |
| 6,313,533 B1 | 11/2001 | Funaya et al. | |
| 6,351,031 B1 | 2/2002 | Iijima et al. | |
| 6,368,895 B1 | 4/2002 | Hori | |
| 6,459,144 B1 | 10/2002 | Pu et al. | |
| 6,515,370 B2 | 2/2003 | Hashimoto | |
| 6,518,649 B1 | 2/2003 | Iwane et al. | |
| 6,518,659 B1 | 2/2003 | Glenn | |
| 6,653,720 B2 | 11/2003 | Kameda | |
| 6,681,982 B2 | 1/2004 | Tung | |
| 6,710,458 B2 | 3/2004 | Seko | |
| 6,724,084 B1 | 4/2004 | Hikita et al. | |
| 6,734,556 B2 | 5/2004 | Shibata | |
| 6,744,122 B1 | 6/2004 | Hashimoto | |
| 6,853,089 B2 | 2/2005 | Ujiie et al. | |
| 7,045,900 B2 | 5/2006 | Hikita et al. | |
| 7,384,863 B2 | 6/2008 | Shibata | |
| 7,466,030 B2 * | 12/2008 | Seko | H01L 24/81 257/E21.511 |
| 8,076,770 B2 | 12/2011 | Kagaya et al. | |
| 2001/0010393 A1 | 8/2001 | Murakami | |
| 2001/0015496 A1 | 8/2001 | Watase et al. | |
| 2001/0050441 A1 | 12/2001 | Shivkumar et al. | |
| 2002/0011664 A1 | 1/2002 | Tanaka | |
| 2002/0028533 A1 | 3/2002 | Tang et al. | |
| 2002/0043704 A1 | 4/2002 | Seko | |
| 2002/0056906 A1 | 5/2002 | Kajiwara et al. | |
| 2003/0087483 A1 | 5/2003 | Iijima et al. | |
| 2003/0183932 A1 | 10/2003 | Tanaka | |
| 2003/0201544 A1 | 10/2003 | Maa et al. | |
| 2003/0222342 A1 | 12/2003 | Chao | |
| 2004/0041262 A1 | 3/2004 | Okamoto et al. | |
| 2004/0061240 A1 | 4/2004 | Seko | |
| 2004/0108594 A1 | 6/2004 | Toyosawa | |
| 2004/0140572 A1 | 7/2004 | Yamate et al. | |
| 2004/0235287 A1 | 11/2004 | Inoue et al. | |
| 2005/0067715 A1 | 3/2005 | Sunohara | |
| 2005/0263909 A1 | 12/2005 | Fukuta et al. | |
| 2006/0170085 A1 | 8/2006 | Fukuta et al. | |
| 2008/0150159 A1 | 6/2008 | Aberin et al. | |
| 2008/0251942 A1 | 10/2008 | Ohuchi et al. | |
| 2011/0019125 A1 | 1/2011 | Nakahama et al. | |

FOREIGN PATENT DOCUMENTS

| | | |
|---|---|---|
| JP | H04290252 A | 10/1992 |
| JP | H06283561 A | 10/1994 |
| JP | H09153519 A | 6/1997 |
| JP | H1098075 A | 4/1998 |
| JP | H11163197 A | 6/1999 |
| JP | H11214586 A | 8/1999 |
| JP | 2000082762 A | 3/2000 |
| JP | 2000340715 A | 12/2000 |
| JP | 2001093935 A | 4/2001 |
| JP | 2001185653 A | 7/2001 |
| JP | 2001217387 A | 8/2001 |
| JP | 2002043352 A | 2/2002 |
| JP | 2002289768 A | 10/2002 |
| JP | 2003007766 A | 1/2003 |
| JP | 2003100809 A | 4/2003 |
| JP | 2004014651 A | 1/2004 |
| JP | 2004186213 A | 7/2004 |
| JP | 2005203488 A | 7/2005 |
| JP | 2006066517 A | 3/2006 |
| TW | 430964 B | 4/2001 |
| TW | 448522 B | 8/2001 |
| TW | 570311 U | 1/2004 |
| TW | M243784 U | 9/2004 |
| WO | 2009116202 A1 | 9/2009 |

\* cited by examiner

SEMICONDUCTOR DEVICE WITH A SEMICONDUCTOR CHIP CONNECTED IN A FLIP CHIP MANNER

CROSS-REFERENCE TO RELATED APPLICATIONS

This application is a continuation of co-pending application Ser. No. 16/703,266 filed on Dec. 4, 2019, and allowed on Jul. 8, 2020, which was a continuation of application Ser. No. 15/806,847 filed on Nov. 8, 2017 (now U.S. Pat. No. 10,522,494, issued on Dec. 31, 2019), which was a continuation of application Ser. No. 15/635,478, filed on Jun. 28, 2017 (now U.S. Pat. No. 9,831,204, issued on Nov. 28, 2017), which was a continuation of application Ser. No. 14/824,706, filed on Aug. 12, 2015 (now U.S. Pat. No. 9,721,865, issued on Aug. 1, 2017), which was a continuation of application Ser. No. 14/276,255, filed on May 13, 2014 (now U.S. Pat. No. 9,117,774, issued on Aug. 25, 2015), which was a continuation of application Ser. No. 13/782,580, filed on Mar. 1, 2013 (now U.S. Pat. No. 8,754,535, issued on Jun. 17, 2014), which was a continuation of application Ser. No. 10/594,561, filed on Sep. 27, 2006 (now U.S. Pat. No. 8,405,227, issued on Mar. 26, 2013), which was the National Stage of international application PCT/JP2005/013355, filed on Jul. 21, 2005. Furthermore, this application claims the benefit of priority of Japanese application 2004-282017, filed on Sep. 28, 2004. The disclosures of these prior International, U.S., and Japanese applications are incorporated herein by reference.

BACKGROUND OF THE INVENTION

Field of the Invention

This invention relates to a semiconductor device that has a semiconductor chip connected in a flip chip manner.

Description of Related Art

To realize a size reduction and high-density packaging of a semiconductor device, attention has been paid to a flip chip connection structure in which a semiconductor chip is connected to a solid state device while causing a functional surface of the semiconductor chip on which a functional element 54 is formed to face the solid state device.

FIG. 4 is a diagrammatic sectional view of a semiconductor device having a flip chip connection structure. This semiconductor device 51 includes a wiring board 52 and a semiconductor chip 53 connected to a surface 52a of the wiring board 52 while causing a functional surface 53a of the semiconductor chip 53 to face the surface 52a of the wiring board 52.

A rectangular connection pad 58 is formed on the surface 52a of the wiring board 52. The wiring board 52 and the semiconductor chip 53 are bonded and electrically connected together with a predetermined interval therebetween by means of a connecting member 55 connected to the connection pad 58. A solder resist film 56 that has a thickness smaller than an interval between the surface 52a of the wiring board 52 and the functional surface 53a of the semiconductor chip 53 is formed on the surface 52a.

The solder resist film 56 has a rectangular opening 56a by which the connection pad 58 is exposed. As shown in FIG. 5, the opening 56a is greater in size than the connection pad 58 when viewed in plane. The connecting member 55 is connected to the connection pad 58 in the opening 56a.

A slight gap is formed between the surface of the solder resist film 56 and the functional surface 53a of the semiconductor chip 53. This gap is sealed with an underfill layer 57. The underfill layer 57 is formed such that the wiring board 52 and the semiconductor chip 53 are bonded together, and then a liquid underfill material is injected therebetween.

In more detail, after the wiring board 52 and the semiconductor chip 53 are bonded together, a dispenser 60 is disposed near the outer peripheral part of the semiconductor chip 53 as shown in FIG. 6A, whereafter a liquid underfill material 57P is poured between the surface of the solder resist film 56 and the functional surface 53a of the semiconductor chip 53 from the dispenser 60. Capillarity causes the underfill material 57P to enter and spread between the surface of the solder resist film 56 and the functional surface 53a of the semiconductor chip 53 as shown in FIG. 6B. When the whole area between the surface of the solder resist film 56 and the functional surface 53a of the semiconductor chip 53 is filled with the underfill material 57P, the dispenser 60 stops discharging the underfill material 57P. Thereafter, the underfill material 57P is hardened, whereby the underfill layer 57 is obtained (see Chee Choong Kooi and six others, "Capillary Underfill and Mold Encapsulation Materials for Exposed Die Flip Chip Molded Matrix Array Package with Thin Substrate", 2003 Electronics Packaging Technology Conference, pp. 324-330).

However, a level difference locates between the inside and the outside of the opening 56a, and a space over the opening 56a is restricted by the semiconductor chip 53. Therefore, disadvantageously, when the underfill material flows into the opening 56a, air that exists around the periphery of the opening 56a (i.e., exists in a portion having the level difference) is taken into the underfill material without sufficiently going out therefrom, and, as a result, a so-called void 61 is generated in the underfill layer 57. For example, if a void is generated in the underfill layer 57, a crack will appear in the underfill layer 57 at a reflow step, thus causing a decrease in reliability of the semiconductor device.

SUMMARY OF THE INVENTION

An object of the present invention is to provide a semiconductor device having a structure capable of preventing a void from occurring in a sealing layer.

The semiconductor device according to the present invention includes a solid state device; a semiconductor chip that has a functional surface on which a functional element is formed and that is bonded on a surface of the solid state device with surface thereof to face a surface of the solid state device while maintaining a predetermined distance between the functional surface thereof and the surface of the solid state device; an insulating film that is provided on the surface of the solid state device facing the semiconductor chip and that has an opening greater in size than the semiconductor chip when the surface of the solid state device facing the semiconductor chip is vertically viewed down in plane; and a sealing layer that seals a space between the solid state device and the semiconductor chip.

According to this invention, the opening of the insulating film is formed to be greater in size than the semiconductor chip when the surface of the solid state device facing the semiconductor chip is vertically viewed down in plane. In other words, the opening of the insulating film is formed such that the semiconductor chip completely falls within the opening when the surface of the solid state device facing the semiconductor chip is vertically viewed down in plane.

Therefore, a level difference caused by the opening of the insulating film can be prevented from locating in a gap between the solid state device and the semiconductor chip, and a space over the periphery of the opening can be prevented from being restricted by the semiconductor chip.

Therefore, in a step of producing this semiconductor device, a void can be prevented from being generated that results from taking air into a liquid sealing resin when a gap between the solid state device and the semiconductor chip is filled with the liquid sealing resin in order to form the sealing layer after forming the insulating film and bonding the solid state device and the semiconductor chip together. As a result, the reliability of the semiconductor device can be improved.

Preferably, the distance between the outer periphery of the semiconductor chip and the edge of the opening of the insulating film is 0.1 mm or more when the surface of the solid state device facing the semiconductor chip is vertically viewed down in plane.

The solid state device may be a wiring board formed by being wired on an insulating substrate, or may be a semiconductor substrate.

The insulating film may be a solder resist. In this case, it is possible to prevent an electric short circuit in an area covered with the solder resist.

The sealing layer may be provided in such a way as to fill the inside of the opening therewith. If so, in the solid state device, a part exposed from the opening of the insulating film can be protected with the sealing layer.

The aforementioned object, other objects, features, and advantageous effects of the present invention will become apparent from the following description of embodiments given with reference to the accompanying drawings.

DESCRIPTION OF THE PREFERRED EMBODIMENTS

Figure 1:
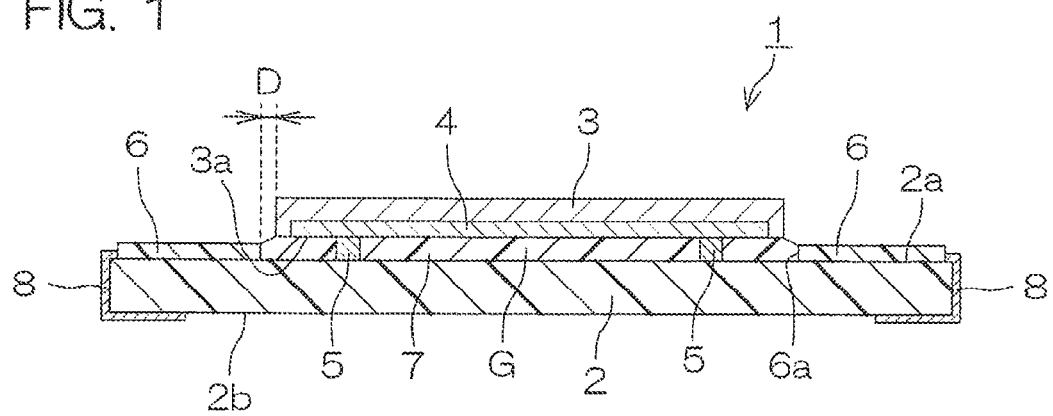
FIG. 1 is a diagrammatic sectional view of a semiconductor device according to a first embodiment of the present invention.

FIG. 1 is a diagrammatic sectional view of a semiconductor device according to a first embodiment of the present invention.

This semiconductor device 1 includes a wiring board 2 and a semiconductor chip 3 connected to the wiring board 2 while causing a functional surface 3*a* of the semiconductor chip 3 to face a surface 2*a* of the wiring board 2. A rectangular connection pad (see FIGS. 2C and 2D) is formed on the surface 2*a* of the wiring board 2. The wiring board 2 and the semiconductor chip 3 are bonded and electrically connected together by means of a connecting member 5 connected to the connection pad, with a predetermined interval between the wiring board 2 and the semiconductor chip 3.

Figure 7:
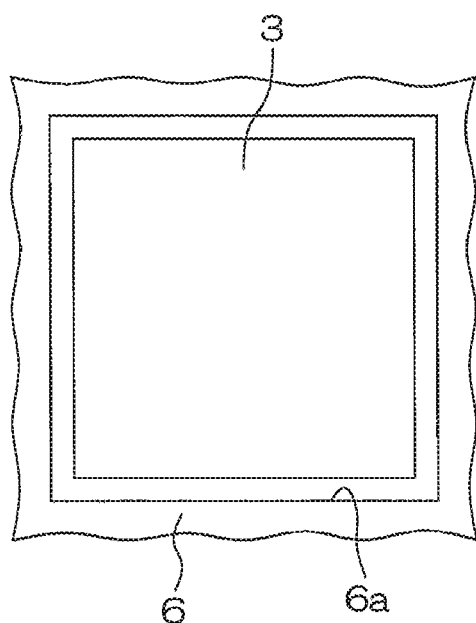
FIG. 7 is a plan view of a semiconductor device according to the first and second embodiments of the invention.

A solder resist film 6 that has a thickness smaller than the interval between the surface 2*a* of the wiring board 2 and the semiconductor chip 3 is formed on the surface 2*a*. This solder resist film 6 serves to prevent an electric short circuit from occurring between wires formed on the surface of the wiring board 2. The solder resist film 6 has an opening 6*a* greater in size than the semiconductor chip 3 when the surface 2*a* is vertically viewed down in plane. In other words, the solder resist film 6 has an opening 6*a* large enough to allow the semiconductor chip 3 to completely fall within the opening 6*a* when the surface 2*a* is vertically viewed down in plane. Accordingly, the solder resist film 6 does not exist in a gap G between the wiring board 2 and the semiconductor chip 3 (i.e., in an area lying between the wiring board 2 and the semiconductor chip 3 and overlapping with the semiconductor chip 3 when the surface 2*a* is vertically viewed from above, as in FIG. 7).

The distance D between the outer periphery of the semiconductor chip 3 and the edge of the opening 6*a* of the solder resist film 6 is set at 0.1 mm or more when the surface 2*a* is vertically viewed down in plane.

An underfill layer 7 is provided in the gap G between the wiring board 2 and the semiconductor chip 3 and in the neighborhood of the gap G. The underfill layer 7 is formed so as to fill the opening 6*a* of the solder resist film 6 therewith. The underfill layer 7 serves to seal the gap G therewith and to protect the functional surface 3*a*, the connecting member 5, and an exposed part of the surface 2*a* exposed from the opening 6*a*.

An end electrode 8 that is electrically connected to the connecting member 5 through a wire (not shown) is formed at each end of the wiring board 2. The end electrode 8 leads from the surface 2*a* of the wiring board 2 to an external connection surface 2*b* which is the surface on the side opposite the surface 2*a* via the end face. In the end electrode 8, the semiconductor device 1 can establish an electric connection with other wiring boards (mounting boards).

FIGS. 2A to 2D are diagrammatic sectional views for explaining a method for producing the semiconductor device 1 shown in FIG. 1. The semiconductor device 1 can be obtained such that the semiconductor chip 3 is bonded to the wiring board 2 while causing the functional surface 3*a* of the semiconductor chip 3 to face the surface 2*a* of the wiring board 2, whereafter an underfill material 7P is injected into the opening 6*a* of the solder resist film 6, and the underfill material 7P is hardened, whereby the underfill layer 7 is formed.

In more detail, a substrate 15 in which a plurality of wiring boards 2 are formed is first prepared.

Thereafter, a liquid, photosensitive solder resist film 6 is applied (for example, according to a spin coat method) or is printed onto the whole of a surface 15*a* of the substrate 15 (i.e., a surface corresponding to the surface 2*a* of the wiring board 2), and the opening 6*a* greater in size than the semiconductor chip 3 is formed by exposure and development.

Thereafter, a semiconductor chip 3 having a projection electrode (bump) 18 connected to an electrode of a functional element 4 is prepared. The projection electrode 18 includes a solder material.

Figure 2A:
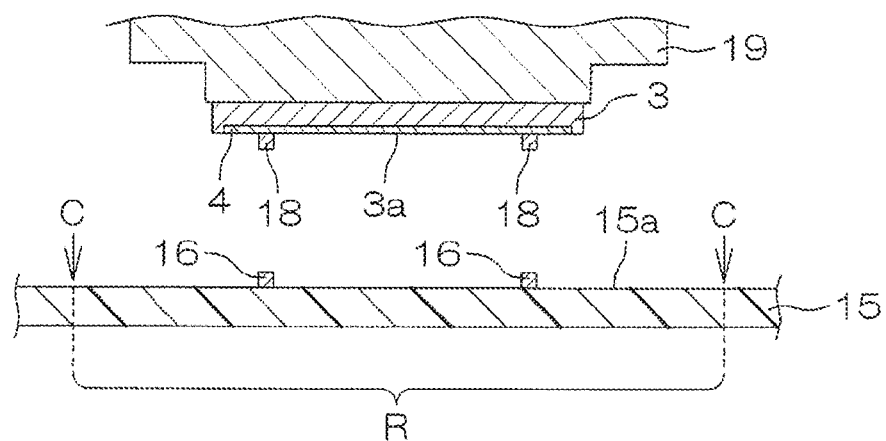
FIG. 2A to FIG. 2D are diagrammatic sectional views for explaining a method for producing the semiconductor device of FIG. 1.

Thereafter, the substrate 15 is kept substantially horizontal while directing the surface 15a thereof upward. The semiconductor chip 3 is held while the surface opposite the functional surface 3a is being absorbed by a bonding tool 19 equipped with a heater for heating therein. The semiconductor chip 3 is caused to face the surface 15a of the substrate 15 while directing the functional surface 3a downward. FIG. 2A shows this state.

Thereafter, the projection electrode 18 of the semiconductor chip 3 is positionally adjusted for the contact with a connection pad 16 of the substrate 15, whereafter the bonding tool 19 is lowered so as to bond the semiconductor chip 3 with the substrate 15. In this case, the semiconductor chip 3 is heated by the bonding tool 19, and the solder material of the projection electrode 18 is melted by that heat, whereby the projection electrode 18 and the connection pad 16 are bonded together. As a result, the connecting member 5 by which the substrate 15 and the semiconductor chip 3 are mechanically bonded together is formed. The wiring formed on the surface 15a of the substrate 15 is electrically connected to the functional element 4 of the semiconductor chip 3 by means of the connecting member 5. As shown in FIG. 1, the functional element 4 is not formed in an end portion or periphery of the functional surface 3a of the semiconductor chip 3, so functional element 4 is formed only on a part of the functional surface of the semiconductor chip.

Figure 2B:
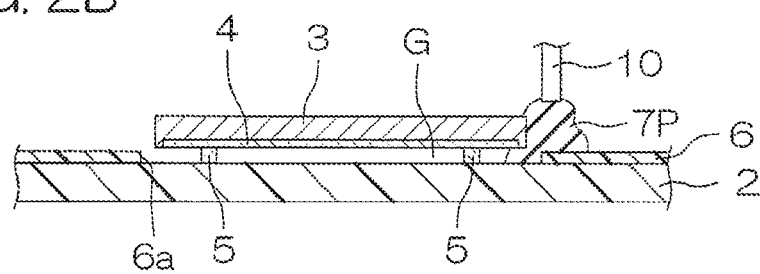

Thereafter, a dispenser 10 is disposed over the periphery of the opening 6a of the solder resist film 6, whereafter the underfill (sealing layer) material 7P is injected from the dispenser 10 into the opening 6a (see FIG. 2B).

Figure 2C:
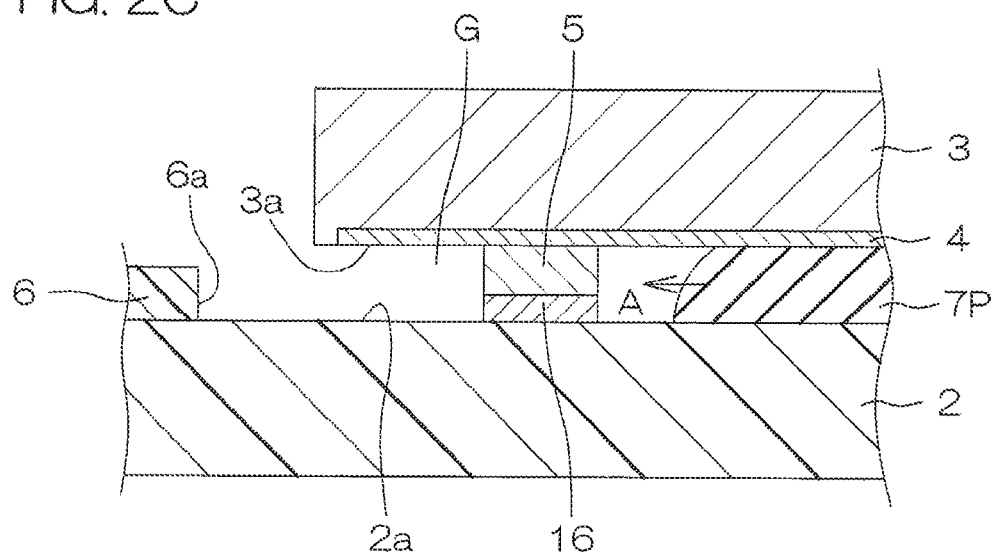
Figure 2D:
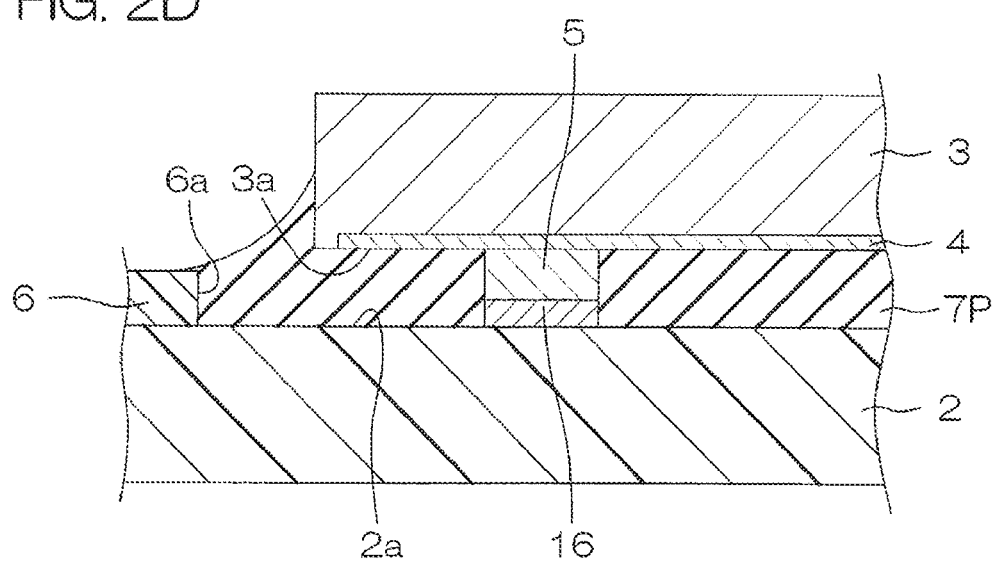

The underfill material 7P enters the gap G between the substrate 15 and the semiconductor chip 3, and spreads on the surface 2a in the gap G by capillarity (see FIG. 2C, wherein the direction in which the underfill material 7P spreads is indicated by arrow "A"). The underfill material 7P is discharged from the dispenser 10 by a suitable quantity. When the gap G and the inside of the opening 6a of the solder resist film 6 are filled with the underfill material 7P, the dispenser 10 stops discharging the underfill material 7P. Thereafter, a process for hardening the underfill material 7P is performed, and the underfill layer 7 is formed in the opening 6a. As shown in FIG. 2D, the underfill or sealing layer 7P does not cover an upper surface of the solder resist film or insulating film 6 and the sealing layer covers a side face of the semiconductor chip 3 up to a middle portion thereof.

Thereafter, the substrate 15 is cut into wiring boards 2 (the cutting position is indicated by reference character "C" in FIG. 2A), and the end electrode 8 is formed at each end of the wiring board 2, thus the semiconductor device 1 of FIG. 1 is obtained.

As described above, the opening 6a of the solder resist film 6 is formed such that the semiconductor chip 3 completely falls within the opening 6a when the surface 15a is vertically viewed down in plane. Accordingly, a level difference caused by the opening 6a of the solder resist film 6 can be prevented from locating in the gap G between the substrate 15 and the semiconductor chip 3, and a space over the periphery of the opening 6a can be prevented from being restricted by the semiconductor chip 3.

Therefore, a void can be prevented from being generated that results from taking air into the underfill material 7P when the liquid underfill material 7P is injected into the gap G between the substrate 15 and the semiconductor chip 3. As a result, the reliability of the thus obtained semiconductor device 1 can be improved.

Since the underfill layer 7 has no void, a crack caused by a void does not occur even when the semiconductor device 1 is bonded with another wiring board according to, for example, a reflow method.

Figure 3:
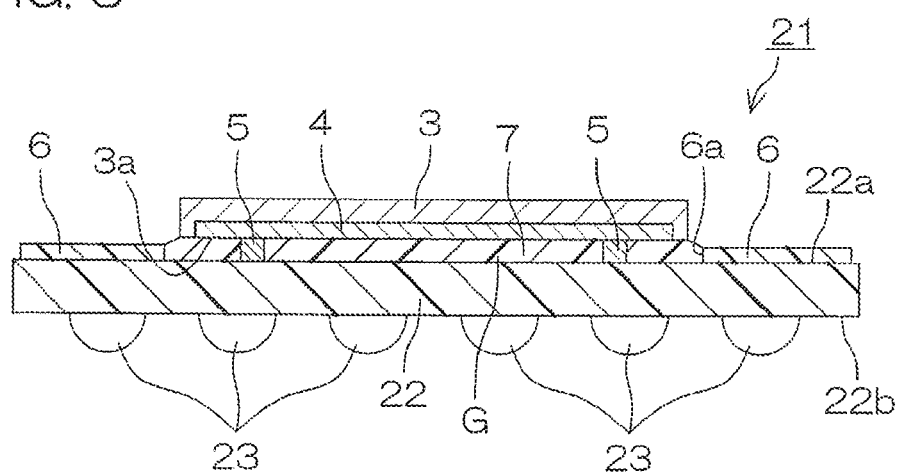
FIG. 3 is a diagrammatic sectional view of a semiconductor device according to a second embodiment of the present invention.
Figure 4:
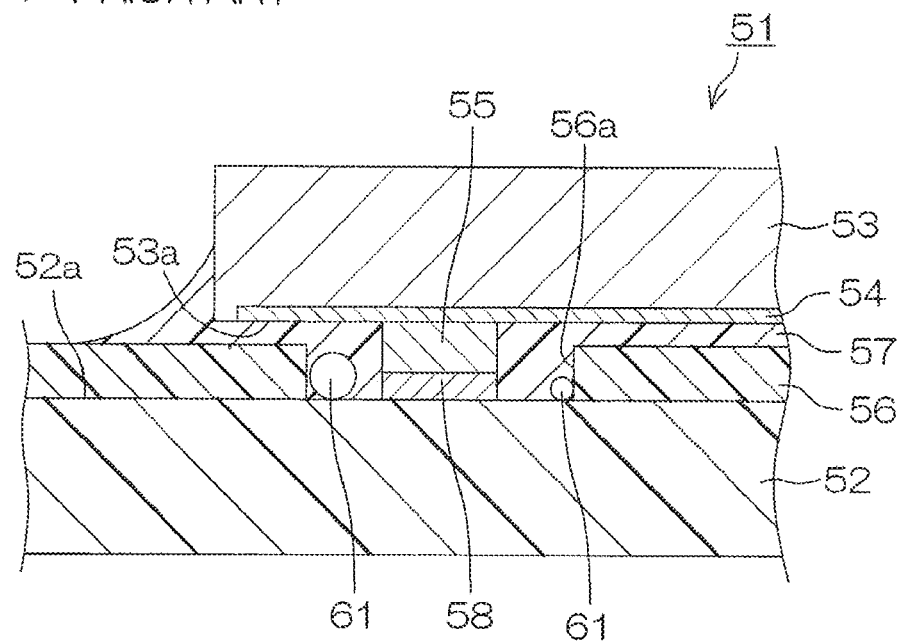
FIG. 4 is a diagrammatic sectional view showing a structure of a conventional semiconductor device that has a semiconductor chip connected in a flip chip manner.
Figure 5:
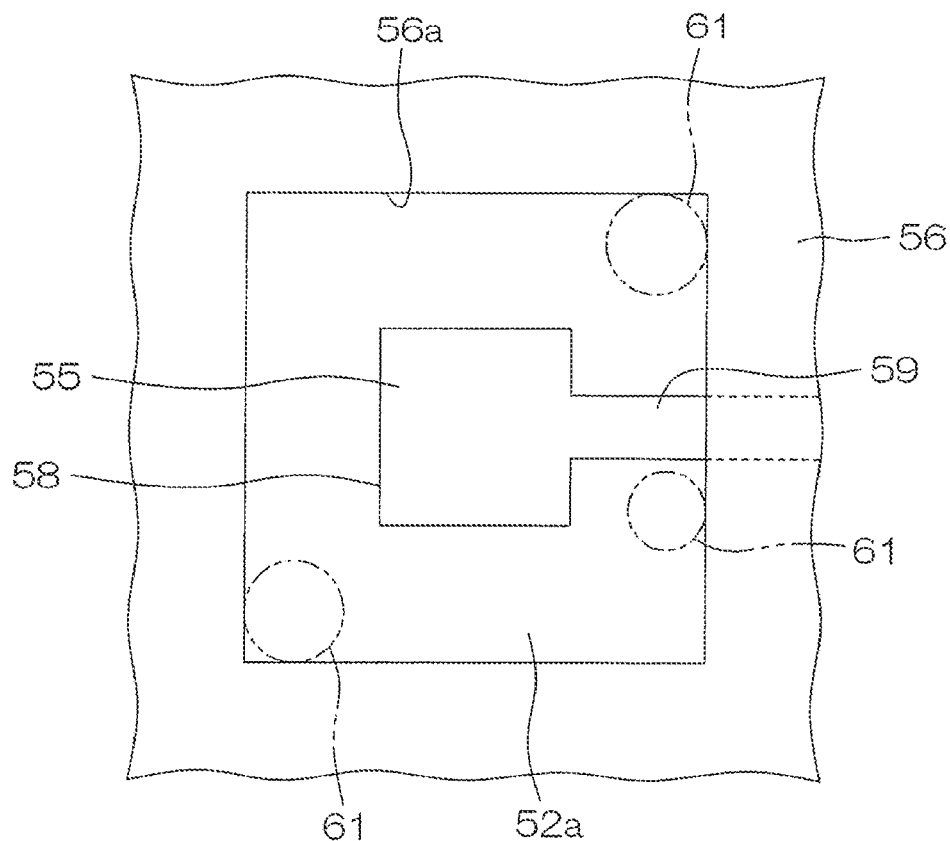
FIG. 5 is a diagrammatic plan view in which a connection surface of a wiring board of FIG. 4 is vertically viewed down.
Figure 6A:
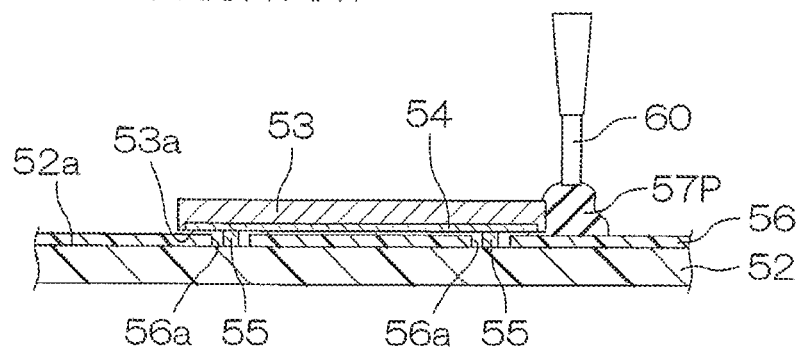
FIG. 6A and FIG. 6B are diagrammatic sectional views for explaining a method for producing the semiconductor device of FIG. 4.
Figure 6B:
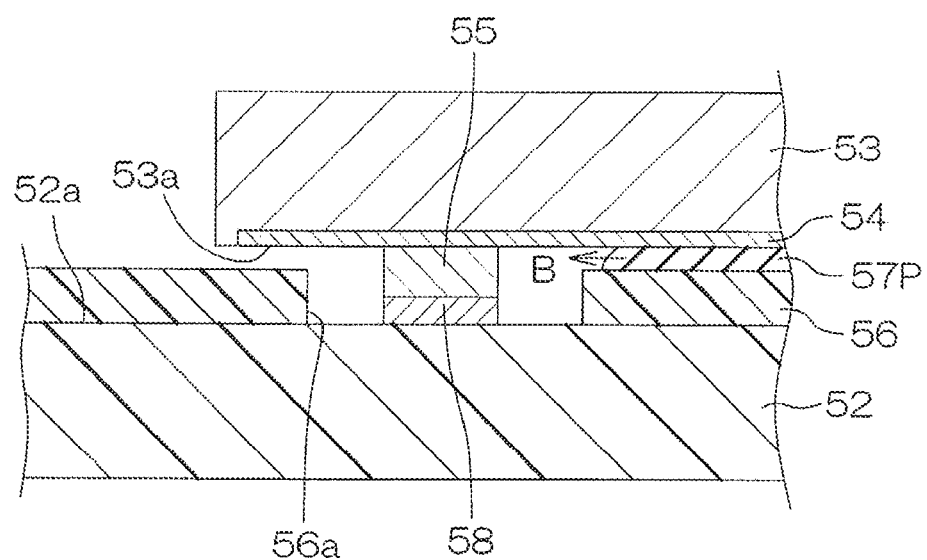

FIG. 3 is a diagrammatic sectional view of a semiconductor device according to a second embodiment of the present invention. In FIG. 3, the same reference character as in FIG. 1 is given to an element corresponding to each element of FIG. 1.

This semiconductor device 21 includes a wiring board 22 and a semiconductor chip 3 connected to the wiring board 22 while causing a functional surface 3a of the semiconductor chip 3 to face a surface 22a of the wiring board 22.

A solder resist film 6 is formed on the surface 22a of the wiring board 22. The solder resist film 6 has an opening 6a that is greater in size than the semiconductor chip 3, in other words, that is formed such that the semiconductor chip 3 completely falls within the opening 6a when the surface 22a is vertically viewed down in plane.

In the wiring board 22, metallic balls 23 are provided on an external connection surface 22b opposite the surface 22a. The metallic balls 23 are re-wired inside the wiring board 22 and/or on the surface of the wiring board 22, and are electrically connected to a connecting member 5 on the side of the surface 22a. The semiconductor device 21 can be bonded with other wiring boards (mounting boards) via the metallic balls 23.

When the semiconductor device 21 is produced, the same producing method as above (see FIGS. 2A to 2D) can be carried out using a substrate on which regions corresponding to a plurality of wiring boards 22 are densely formed, instead of the substrate 15. The metallic balls 23 may be bonded with this substrate before cutting the substrate into pieces of the wiring board 22, or may be bonded with the wiring boards 22 after cutting the substrate into pieces of the wiring board 22.

Although the embodiments of the present invention have been described as above, the present invention can be embodied in other forms. For example, two or more semiconductor chips 3 may be connected to the wiring boards 2 and 22 in a flip chip manner. In this case, the solder resist film 6 can have at least one opening 6a that completely includes each semiconductor chip 3 when the surfaces 2a and 22a are vertically viewed down in plane.

The embodiments of the present invention have been described in detail. However, these are merely concrete examples used to clarify the technical contents of the present invention, and the present invention should not be understood while being limited to these examples, and the spirit and scope of the present invention are limited only by the scope of the appended claims.

What is claimed is:

1. A semiconductor device comprising:
   a wiring board,
   a semiconductor chip having a functional surface,
   a connecting member provided between one surface of the wiring board and the functional surface of the semiconductor chip, the connecting member extending a distance between the one surface of the wiring board and the functional surface of the semiconductor chip,
   a sealing material that seals a gap space between the wiring board and the semiconductor chip, and
   an electrode formed at the one surface of the wiring board and arranged outside of an outer periphery of the sealing material,
   wherein a lateral distance between an outer periphery of the semiconductor chip and the outer periphery of the sealing material is between 0.1 mm and a lateral distance from the outer periphery of the semiconductor chip to the electrode, wherein the wiring board includes an insulating pattern provided on the one surface thereof, the insulating pattern not overlapping with the sealing material when viewed in a plan view.

2. The semiconductor device according to claim 1, wherein the sealing material seals at least a portion of a side surface of the semiconductor chip.

3. The semiconductor device according to claim 2, wherein a thickness of the insulating pattern is thinner than a thickness of the connecting member.

4. The semiconductor device according to claim 3, wherein the connecting member is provided within the outer periphery of the semiconductor chip.

5. The semiconductor device according to claim 4, wherein the outer periphery of the sealing material has a surface portion, and a center of curvature of the surface portion is located to the one surface of the wiring board.

6. The semiconductor device according to claim 5, wherein an electrical connecting pattern is formed at the one surface of the wiring board and the electrical connecting pattern is connected to the connecting member.

7. The semiconductor device according to claim 6, wherein the functional surface of the semiconductor chip is provided in an area other than an edge of the semiconductor chip.

8. The semiconductor device according to claim 7, wherein the sealing material is not provided at an opposite surface of the functional surface of the semiconductor chip.

9. The semiconductor device according to claim 8, wherein the sealing material is provided at more than half of a height of the semiconductor chip.

10. The semiconductor device according to claim 9, wherein the sealing material is an underfill material.

11. The semiconductor device according to claim 10, wherein an external ball terminal is provided between the electrode and a center of the semiconductor chip in the plan view.

* * * * *